United States Patent [19]

Michel

[11] Patent Number: 4,806,874
[45] Date of Patent: Feb. 21, 1989

[54] SWITCHED CAPACITOR AMPLIFIER CIRCUIT

[75] Inventor: Jean-Yves Michel, Santa Clara, Calif.

[73] Assignee: National Semiconductor Corporation, Santa Clara, Calif.

[21] Appl. No.: 176,535

[22] Filed: Apr. 1, 1988

[51] Int. Cl.$^4$ .............................................. H03F 1/02
[52] U.S. Cl. ......................................... 330/9; 330/107
[58] Field of Search ............................ 330/9, 107, 109

[56] References Cited

U.S. PATENT DOCUMENTS 4,446,438  5/1984  Chang et al. ............................ 330/9

Primary Examiner—Gene Wan
Attorney, Agent, or Firm—Mark Aaker; Lee Patch; Gail W. Woodward

[57] ABSTRACT

A switched capacitor amplifier circuit using a pair of switched capacitors to replace each resistor element of an inverting operational amplifier circuit, with the capacitors operating on opposite halves of the switching cycle to provide reduced sampling distortion.

2 Claims, 5 Drawing Sheets

SWITCHED CAPACITOR AMPLIFIER CIRCUIT

BACKGROUND OF THE INVENTION

1. Field of the Invention

This invention relaes to an electronic amplifier circuit, in particular to an amplifier circuit based upon an operational amplifier and using switched capacitor circuits to replace resistor elements.

2. Description of the Prior Art

Many traditional amplifier circuit designs have not been suitable for fabrication as integrated circuits because certain components required in those designs, such as inductors, large capacitor values, or precise resistor values can not be easily obtained with standard metal oxide semiconductor (MOS) fabrication processes. Therefore, new designs have been developed to reduce the need for these difficult components. This invention furthers this trend, by replacing critical value resistors with switched capacitor circuits that can be easily integrated.

An amplifier circuit known in the art is shown in FIG. 1. This circuit uses an operational amplifier 12 with an inverting input terminal 14, a non-inverting input terminal 16, and a single output terminal 18. The input signal V1 passes through the input resistor R1 to the inverting input terminal 14. The non-inverting input terminal is connected to ground. The output signal at the output terminal 18 provides the amplifier circuit output signal at output node V2. The output signal is also returned through feedback resistor R2 to the inverting input terminal 14.

The gain and other response characteristics from the V1 node to the V2 node of this circuit are determined by the elements in the feedback path from the output terminal 18 back to the inverting input terminal 14. In particular, in the configuration shown, the voltage gain, V2/V1, of the circuit is set by the ratio of the feedback resistor R2 to the input resistor R1. Capacitors are sometimes used in the feedback path to control the frequency response of the circuit.

A problem with the direct implementation of this amplifier circuit as a MOS integrated circuit is that the precise value of resistors after the completion of the fabrication processes cannot be predicted. Therefore, it is difficult to insure that a precise ratio of R2 to R1 will be achieved. Therefore, the voltage gain of the circuit cannot be accurately predicted. This invention provides switched capacitor circuits to replace the resistor elements. The switched capacitor circuits are made of small capacitors and switching transistors. Small capacitors can be quite precisely manufactured due to the highly uniform thickness of oxide layers used as dielectric material, and the precise control of capacitor area provided by the fine masking methods used. The switching transistors can be precisely manufactured and will be controlled by a pair of clock signals. Therefore, the characteristics of the switched capacitor circuits can be predicted and controlled. This allows the manufacture of a final amplifier circuit of specific, stable, and predictable gain.

Switched capacitor circuits used switching transistors to control the application of signals to a set of capacitors. By controlling the frequency of switching action and the arrangement of switches and transistors, the rate of transfer of charge, frequency-selective characteristics, or digital sample and hold operations can be achieved.

Switched capacitor circuits have been used in the manufacture of band pass filters. They have also previously been used in the feedback loop of operational amplifiers, but not in the particular configuration and providing the valuable characteristics of this invention.

For example, FIG. 2 shows an amplifier circuit known in the art in which the resistors R1 and R2 of the operational amplifier circuit of FIG. 1 are replaced with standard switched capacitor circuits.

The input resistor R1 of FIG. 1 is replaced in FIG. 2 with switches 20 and 21, input capacitor C1, and switches 22 and 23. Feedback resistor R2 of FIG. 1 is replaced in FIG. 2 with switches 40 and 41, feedback capacitor C2, and switches 42 and 43.

The switches are implemented by any of several known configurations of MOS switching transistors. The simplest implementation as shown in FIG. 2 uses a single MOS transistor as a pass transistor. The switches are controlled by non-overlapping clock signals P1 and P2 as shown in FIG. 3, in order to alternately connect or ground the associated capacitor. When the capacitor is not connected in the signal path it is switched to ground to prevent accumulation of charge, which would prevent accurate following of the input signal. For example, during clock signal P1, switches 20 and 22 connect input capacitor C1 as the input path, and switches 40 and 42 connect feedback capacitor C2 as the feedback path. During clock signal P2, input capacitor C1 is grounded by switches 21 and 23, and feedback capacitor C2 is grounded by switches 41 and 43.

Since each capacitor will be passing signal only during periods when it is switched in the signal path, the total signal transfer will be reduced proportionately to the time it is switched out of the signal path. In this way, the switched capacitor circuit replaces the prior use of resistor elements.

Other examples of the use of switched capacitors to replace resistor elements are U.S. Pat. No. 4,404,525 to Amir et al., with switched capacitors in the input and feedback paths, and U.S. Pat. No. 4,441,080 to Saari, with switched capacitors in the feedback path.

Several problems arise with these prior solutions. First, the input and feedback signals are sampled only during periods when the capacitors are switched in. This results in a "stair-step" or aliasing type of waveform distortion, where a more linear version of the signals is desired.

Another problem is that these circuits drastically alter the characteristics of the feedback path when the feedback capacitor is switched out. The feedback path is simply open-circuitry for part of the time. This can cause drastic change in circuit operation. For example, if the feedback path is opened, a holding capacitor would be required to maintain the amplifier function. Parasitic or stray capacitance across the switching transistors can serve this function by default. However, this capacitance introduces frequency sensitive characteristics and adds a parasitic pole to the amplifier characteristics, essentially imposing a low-pass filter operation on the circuit.

This invention resolves both of these problems, avoiding stair step distortion, and maintaining stable feedback path characteristics.

SUMMARY OF THE INVENTION

This invention provides unique circuitry based on easy to fabricate transistors and capacitors to replace precise resistors and resistor ratios. The switched capacitor circuits used in this invention can be precisely manufactured, and therefore the circuit gain can be quite precisely predicted. This invention uses switched capacitor circuits taking alternating samples of the signal. In this way, stair-step distortion is reduced, and the feedback path characteristics remain stable throughout the switching cycle.

FIG. 4 shows an amplifier circuit in accordance with the present invention. The resistor elements of the common amplifier circuit of FIG. 1 are each replaced with a pair of switched capacitor circuits. Each switch is activated by one of a pair of non-overlapping clock signals, P1 or P2, as shown in FIG. 3.

As shown in FIG. 4, in this invention, the input signal V1 is split to a pair of switched capacitor circuits. During clock signal P1, the input signal is connected by switches 20 and 22 through input capacitor C1 to the inverting input terminal 14. During clock signal P2, the signal is connected by switches 24 and 26 through input capacitor C3 to the inverting input terminal 14. By this use of a pair of input circuits, and sampling by each circuit during its active period, the input signal is sampled throughout the switching cycle, reducing stair-step distortion as compared to prior art circuits, which had no sampling during half of their switching cycle.

During P2 clock signal, input capacitor C1 is grounded by switches 21 and 23. During the P1 clock signal, input capacitor C3 is grounded by switches 25 and 27. By this grounding, charge cannot accumulate on the capacitors, and the signal can be followed more accurately.

Similarly, the feedback signal from the output terminal 18 is controlled by switching between two switched capacitor circuits. During clock signal P1, the feedback signal is connected by switches 40 and 42 through feedback capacitor C2 to the inverting input terminal 14. During clock signal P2, the feedback signal is connected by switches 44 and 46 through feedback capacitor C4 to the inverting input terminal 14.

During the P2 clock signal, feedback capacitor C2 is grounded by switches 41 and 43. During the P1 clock signal, feedback capacitor C4 is grounded by switches 45 and 47. By this grounding, charge cannot accumulate on the capacitors, and the signal can be followed more accurately.

The gain of this switched capacitor amplifier circuit is set by the ratio of the input capacitance to the feedback capacitance, the ratio of C1 to C2 or the ratio of C3 to C4. For example, C1 need not be equal to C3, but the ratio of C1/C2 should equal the ratio of C3/C4 to assure equal gain during each half of the switching cycle.

The use of matched capacitors and matched switches in the input and feedback circuits also reduces clock feedthrough, the appearance of clock signal components in the output signal. This is achieved by self cancellation of the clock signal by the two matched capacitors working on opposite clock phases.

Because the values of the feedback and input capacitors can be precisely manufactured, the ratio between these capacitors, and the gain of the amplifier can be precisely predicted. Also, the gain may be changed by switching in additional capacitors.

The feedback path is stable during the switching cycle because a feedback path is provided during both halves of a switching cycle.

Since no unsampled period occurs in the input or feedback paths, no aliasing and little waveform distortion occurs, and a more linear output is provided.

DESCRIPTION OF THE PREFERRED EMBODIMENTS

Figure 4:
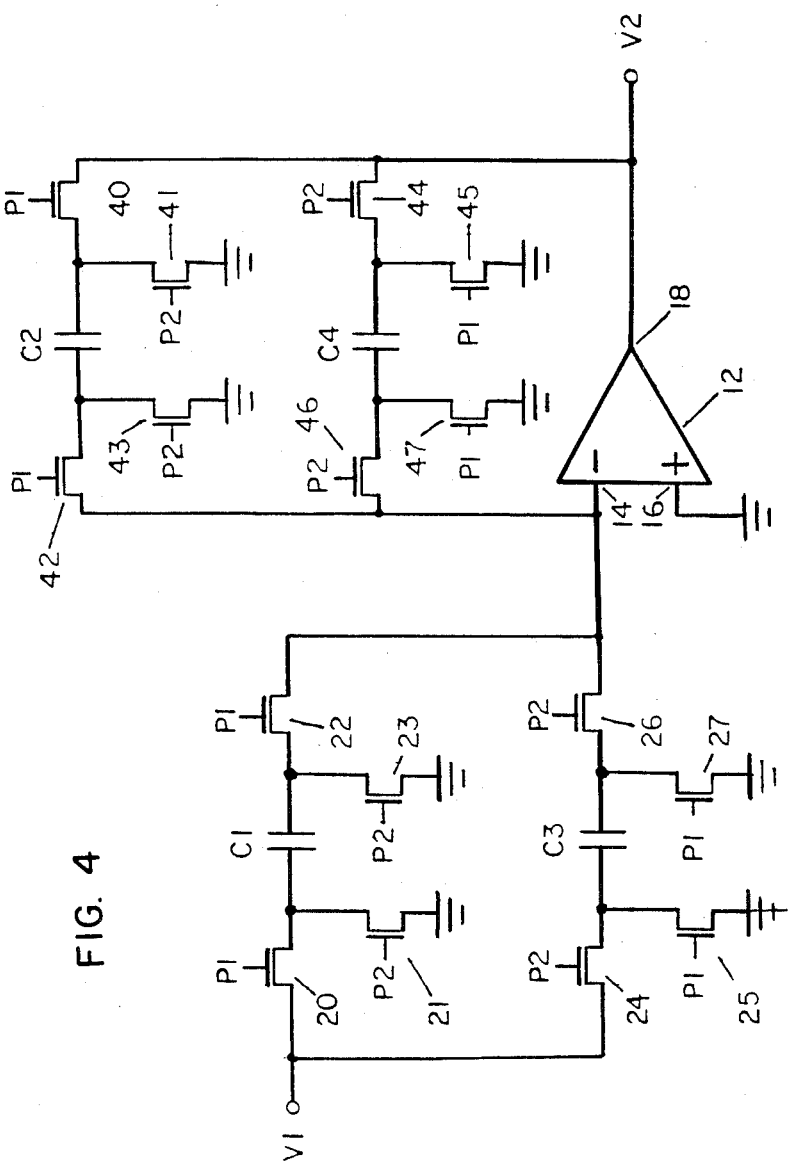
FIG. 4 shows a switched capacitor amplifier in accordance with the present invention.
Figure 5:
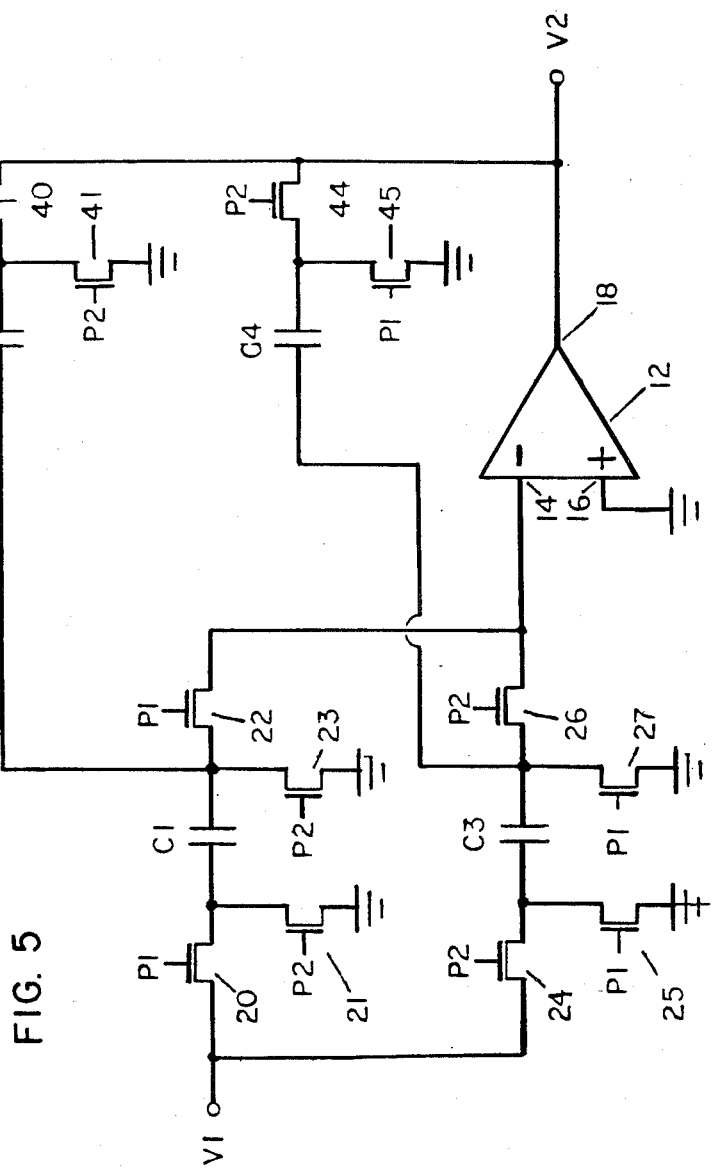
FIG. 5 shows a preferred embodiment of the invention which reduces the number of switching transistors required.

FIG. 5 shows a preferred embodiment of the present invention. This embodiment uses fewer switching transistors than the embodiment previously shown and described in FIG. 4.

In this preferred embodiment shown in FIG. 5, an operational amplifier 12 with an inverting input terminal 14, a non-inverting input terminal 16, and an output terminal 18 is used. The non-inverting input terminal 16 is connected to ground or to a reference voltage. The outputterminal 18 is connected to the output node V2.

A pair of first and second input capacitors C1 and C3, and a pair of first and second feedback capacitors C2 and C4 are used.

The output terminal 18 is fed back to the inverting input terminal 14 alternately through two feedback paths. The first feedback path consists of switches 40 and 41, feedback capacitor C2, and switches 22 and 23. The second feedback path consists of switches 44 and 45, feedback capacitor C4, and switches 26 and 27.

The input signal from input node V1 is connected to the inverting input terminal alternately through two input paths. The first input path consists of switches 20 and 21, input capacitor C1, and switches 22 and 23. The second input path consists of switches 24 and 25, input capacitor C3, and switches 26 and 27.

It can be seen that switches 22 and 23, and switches 26 and 27, are used by both the input and feedback paths. It is this combined use which allows this embodiment to have fewer switching transistors than the embodiment previously shown and described in FIG. 4.

Figure 1:
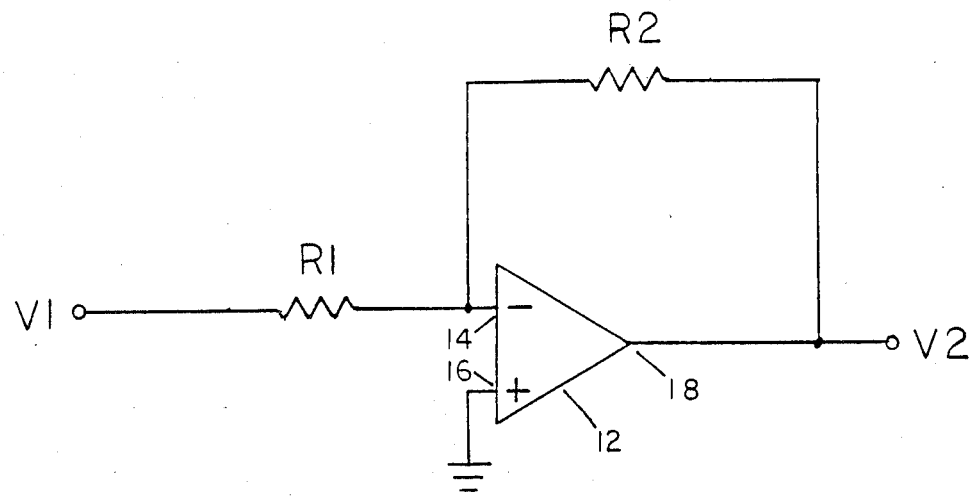
FIG. 1 shows a prior art circuit for an operational amplifier using an input resistor R1 and feedback resistor R2.
Figure 2:
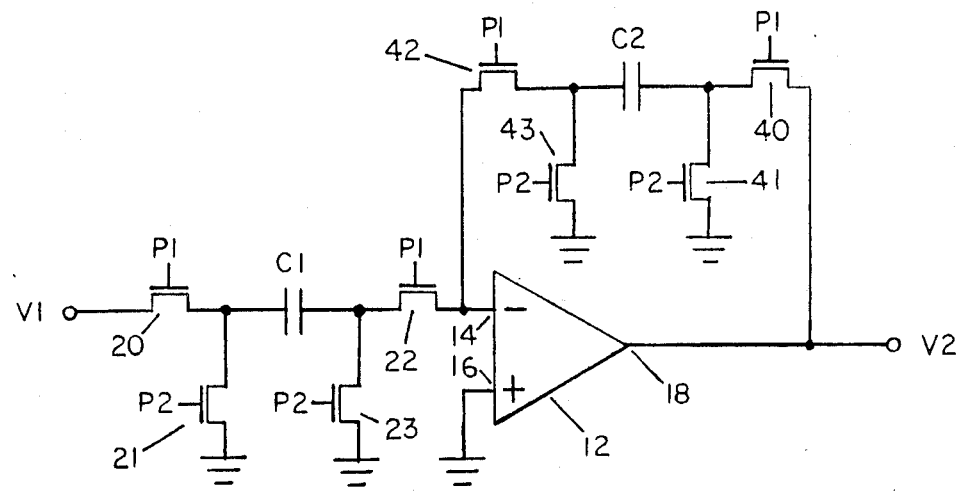
FIG. 2 shows a prior art circuit replacing the resistors of FIG. 1 with a standard switched capacitor circuits.
Figure 3:
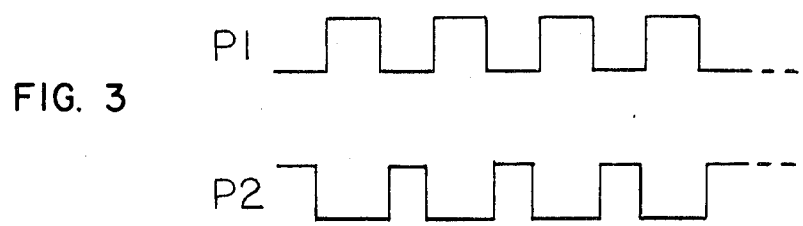
FIG. 3 shows non-overlapping clock signals P1 and P2 as used in this invention.

The switches are controlled by one of two non-overlapping clock signals, P1 or P2, as shown in FIG. 3. The use of slightly delayed or advanced clock signals can be used to precisely sequence the switching of transistors if certain switching overlaps or exclusiveness is desired.

In the input path, take for example input capacitor C1. During the P1 clock signal, the input signal on input node V1 is conducted through switch 20 to the first plate of input capacitor C1. The signal continues from the second plate of input capacitor C1 through switch 22 to the inverting input terminal 14. During the P2 clock signal, switches 20 and 22 will open, isolating input capacitor C1 from the input signal. Switches 21 and 23 will be conducting and will ground the capacitor C1. Grounding the capacitor will remove accumulated charge which would prevent accurate following of the input signal. Similar operation will occur on input capacitor C3, but on the alternate clock signals.

In the feedback path, take for example feedback capacitor C2. During the P1 clock signal, the output terminal 18 is connected by switch 40 to the first plate of first feedback capacitor C2. The second plate of first feedback capacitor C2 is connected by switch 22 to the inverting input terminal 14. During the P2 clock signal, switches 40 and 22 will open, isolating feedback capacitor C2 from the feedback signal. Switches 41 and 23 will be conducting and will ground the feedback capacitor C2. Grounding the capacitor will remove accumulated charge which would prevent accurate following of the feedback signal. Similar operation will occur on feedback capacitor C4, but on the alternate clock signals.

Therefore, during the alternating clock signals P1 and P2, alternating pairs of input and feedback capacitors are operating.

Since no unsampled period occurs in the input or feedback paths, no aliasing and little waveform distortion occurs, and a more linear output is provided.

Figure 6:
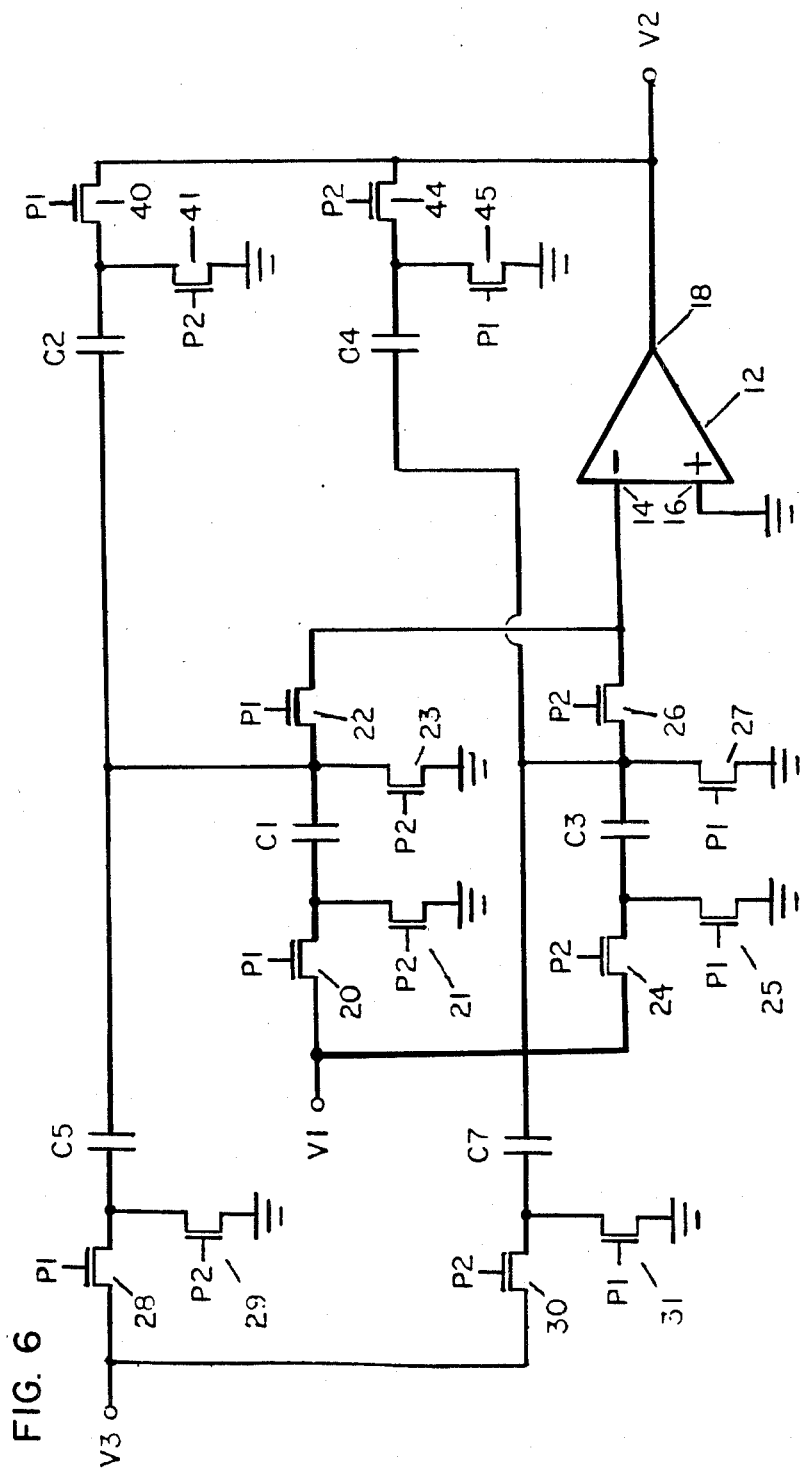
FIG. 6 shows useful application of the invention in a summing amplifier to combine multiple input signals in precise ratios without requiring precision resistor networks.

FIG. 6 shows another useful application of this invention in a summing amplifier to combine multiple input signals in precise ratios without requiring precision resistor networks. The first input signal from first input node V1 is alternated onto a pair of input capacitors C1 and C3. A second input signal from a second input node V3 is alternated onto a pair of input capacitors C5 and C7. Only one set of feedback capacitors C2 and C4 are required. The signals from the pairs of input capacitors are summed at the inverting input terminal 14. Each input signal is added in proportion to the value of its input capacitors. The value of the feedback capacitors is set to determine the overall gain of the stage. For a two input circuit the output voltage is:

$$V2 = -(C1/C2)*V1 - (C5/C2)*V3$$

An advantage of this summing amplifier circuit is that precise ratios can be achieved between the small input capacitors. Therefore the amount of signal combined from each input can be precisely set. Also, the ratios can be changed by switching in additional capacitors.

This summing amplifier can be expanded to include additional input signals by the additional of an pair of input capacitors and switches for each additional input. No additional feedback capacitors are required.

Figure 7:
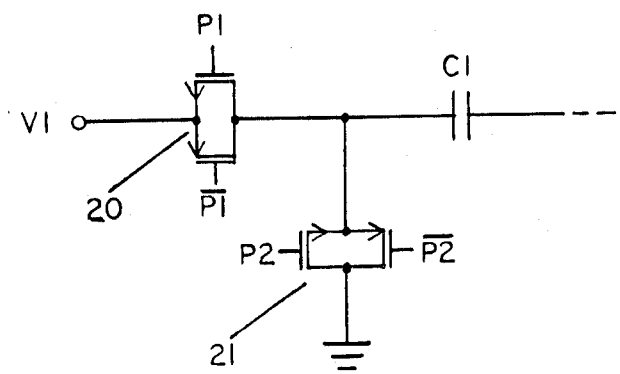
FIG. 7 shows a preferred embodiment of the transistor switches used in this invention.

The switches used in this invention can be implemented by any of several known configurations of MOS switching transistors. The simplest implementation would use a single MOS transistor as a pass transistor. However, to assure switching action even with high or low voltages externally applied to either switch terminal, a pair of transistors known as a transfer gate is preferred for each switch. FIG. 7 shows the replacement of switches 20 and 21 with a preferred switch embodiment using transfer gates. Each switch includes an n-channel and a p-channel MOS transistor. The switch 20 is controlled by a clock signal P1 and its inversion $\overline{P1}$. When clock signal P1 is high, and therefore its inversion $\overline{P1}$ will be low, both transistors will be conducting. Therefore switch 20 can be viewed as being closed and conducting during clock signal P1. The frequency and pulse width of the P1 clock signal can be set to control the amount of signal transferred through the switch 20.

Therefore, in this invention we have developed a method of providing a switched capacitor amplifier, where the final gain can be precisely predicted, and the amplifier has reduced distortion and improved linear output of signal. This invention can also be extended to a design of a summing amplifier which can combine input signals in precise ratios. Other embodiments and advantages will be apparent to those skilled in the art from a consideration of this specification, the drawings, and the claims which follow.

I claim:

1. An amplifier circuit including an input node and output node, said circuit comprising:
   an operational amplifier with an inverting input terminal, a non-inverting input terminal connected to a reference voltage, and an output terminal connected to said output node;
   first and second input capacitors each with an input plate and output plate;
   a first switch means connecting said input plate of said first input capacitor to said input node during a first time period, and connecting said input plate of said first input capacitor to a reference voltage during a second time period;
   a second switch means connecting said output plate of said first input capacitor to said inverting input terminal of said operational amplifier during a first time period, and connecting said output plate of said first input capacitor to a reference voltage during a second time period;
   a third switch means connecting said input plate of said second input capacitor to a reference voltage during a first time period, and connecting said input plate of said second input capacitor to said input node during a second time period;
   a fourth switch means connecting said output plate of said second input capacitor to a reference voltage during a first time period, and connecting said output plate of said second input capacitor to said inverting input terminal of said operational amplifier during a second time period;
   first and second feedback capacitors each with an input plate and output plate;
   said input plate of said first feedback capacitor connected to said output plate of said first input capacitor;
   fifth switch means connecting said output plate of first feedback capacitor to said output terminal of said operational amplifier during a first time period, and connecting said output plate of first feedback capacitor to a reference voltage during a second time period;
   said input plate of said second feedback capacitor connected to said output plate of said second input capacitor;
   sixth switch means connecting said output plate of said second feedback capacitor to a reference voltage during a first time period, and connecting said output plate of said second feedback capacitor to said output terminal of said operational amplifier during a second time period;
   whereby input and feedback paths for the operational amplifier are through first input and first feedback capacitor during a first time period, and through second input and second feedback capacitor during a second time period.

2. A switched capacitor amplifier as in claim 1 further comprising:

a second input node;

third and fourth input capacitors each with an input plate and output plate;

a seventh switch means connecting said input plate of said third input capacitor to said second input node during a first time period, and connecting said input plate of said third input capacitor to a reference voltage during a second time period;

an eighth switch means connecting said input plate of said fourth input capacitor to said second input node during a second time period, and connecting said input plate of said fourth input capacitor to a reference voltage during a first time period;

said output plate of said third input capacitor connected to said output plate of said first input capacitor; and said output plate of said fourth input capacitor connected to said output plate of said second input capacitor.

* * * * *